United States Patent
Yoon et al.

(10) Patent No.: US 11,361,899 B2
(45) Date of Patent: Jun. 14, 2022

(54) APPARATUS INCLUDING ELECTRONIC CIRCUIT FOR PROCESSING DIFFERENTIAL SIGNAL

(71) Applicant: Samsung Electronics Co., Ltd., Suwon-si (KR)

(72) Inventors: Youngchang Yoon, Suwon-si (KR); Jaehyup Kim, Suwon-si (KR); Sangmin Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 79 days.

(21) Appl. No.: 16/739,564

(22) Filed: Jan. 10, 2020

(65) Prior Publication Data

US 2020/0227203 A1 Jul. 16, 2020

(30) Foreign Application Priority Data

Jan. 10, 2019 (KR) .................. 10-2019-0003451

(51) Int. Cl.
*H01F 27/29* (2006.01)
*H03H 7/38* (2006.01)
*H03H 7/06* (2006.01)
*H03H 7/01* (2006.01)

(52) U.S. Cl.
CPC ........... *H01F 27/29* (2013.01); *H03H 7/0138* (2013.01); *H03H 7/06* (2013.01); *H03H 7/38* (2013.01)

(58) Field of Classification Search
CPC ........ H01F 27/29; H03H 7/0138; H03H 7/06; H03H 7/38
See application file for complete search history.

(56) References Cited

U.S. PATENT DOCUMENTS

| 9,755,606 | B2* | 9/2017 | Ueki ..................... H03H 7/427 |
| 2004/0227608 | A1 | 11/2004 | Nakatani et al. |
| 2007/0025043 | A1 | 2/2007 | Terada et al. |
| 2007/0240298 | A1 | 10/2007 | Terrovitis |
| 2008/0174394 | A1 | 7/2008 | Lee |
| 2011/0007438 | A1 | 1/2011 | Ito et al. |
| 2012/0262237 | A1 | 10/2012 | Kawakami et al. |

(Continued)

FOREIGN PATENT DOCUMENTS

KR    10-1390701 A    5/2014

OTHER PUBLICATIONS

Lee et al., "A Differentially Coupled Series Inductor For Differential RFICs," Microwave And Optical Technology Letters, vol. 57, No. 9, Sep. 2015, pp. 2223-2225.

(Continued)

*Primary Examiner* — Stephen E. Jones
*Assistant Examiner* — Kimberly E Glenn
(74) *Attorney, Agent, or Firm* — Jefferson IP Law, LLP

(57) ABSTRACT

An apparatus is provided. The apparatus includes an electronic circuit for processing a differential signal. A device including an electronic circuit may include a first inductor and a second inductor that process a differential signal, a first circuit connected to the first inductor in parallel, a second circuit connected to the second inductor in parallel, and lines connecting the first inductor and the first circuit, the lines being disposed to pass through an area defined by the first inductor and the second inductor. The first inductor and the second inductor have symmetrical differential structures.

20 Claims, 11 Drawing Sheets

→ : DIRECTION OF CURRENT

(56) References Cited

U.S. PATENT DOCUMENTS

2014/0197916 A1    7/2014  El-Tanani et al.
2018/0102737 A1    4/2018  Wu et al.
2020/0136581 A1*   4/2020  Tanaka .................. H03F 1/3282

OTHER PUBLICATIONS

Danesh et al., "Differentially Driven Symmetric Microstrip Inductors," IEEE Transactions On Microwave Theory And Techniques, vol. 50, No. 1, Jan. 2002, pp. 332-341.
H.Y. David Yang, "Design Consideration of Differential Inductors in CMOS Technology for RFIC," 2004 IEEE Radio Frequency Integrated Circuits Symposium, Jun. 6-8, 2004, pp. 449-452.
International Search Report dated May 6, 2020, issued in an International Application No. PCT/KR2020/000446.
Extended European Search Report dated Feb. 23, 2022, issued in European Patent Application No. 20738659.0.

* cited by examiner

APPARATUS INCLUDING ELECTRONIC CIRCUIT FOR PROCESSING DIFFERENTIAL SIGNAL

CROSS-REFERENCE TO RELATED APPLICATION(S)

This application is based on and claims priority under 35 U.S.C. § 119(a) of a Korean patent application number 10-2019-0003451, filed on Jan. 10, 2019, in the Korean Intellectual Property Office, the disclosure of which is incorporated by reference herein in its entirety.

BACKGROUND

1. Field

The disclosure relates to an electronic circuit. More particularly, the disclosure relates to a device including an electronic circuit for processing a differential signal.

2. Description of Related Art

In a radio frequency (RF) or analog circuit, a differential structure that is more advantageous than a single-ended structure in aspects of noise immunity, a large swing, and linearity has been widely used. The differential structure has a disadvantage in aspects of area and power as compared with the single-ended structure, but is preferred due to benefits in the above-described aspects.

An input/output matching circuit for removal of reflective waves of a high-frequency wave circuit and effective delivery of power or a filter circuit for selecting or removing a band signal requires an inductance, and thus inductors are frequently used. Because the inductances of the inductors generally are proportional to the size of an element, a large area is required according to the required inductance. Accordingly, a disadvantage of a differential structure that is disadvantageous in area may be highly significant.

The above information is presented as background information only to assist with an understanding of the disclosure. No determination has been made, and no assertion is made, as to whether any of the above might be applicable as a prior art with regard to the disclosure.

SUMMARY

Aspects of the disclosure are to address at least the above-mentioned problems and/or disadvantages and to provide at least the advantages described below. Accordingly, an aspect of the disclosure is to provide an electronic circuit of a differential structure having a structure for decreasing an area occupied by an inductor.

Another aspect of the disclosure is to provide a device including an electronic circuit having a connection structure that can alleviate deterioration of performance due to parasitic inductances.

Additional aspects will be set forth in part in the description which follows and, in part, will be apparent from the description, or may be learned by practice of the presented embodiments.

In accordance with an aspect of the disclosure, a device is provided. The device includes an electronic circuit may include a first inductor and a second inductor that process a differential signal, a first circuit connected to the first inductor in parallel, a second circuit connected to the second inductor in parallel, and lines connecting the first inductor and the first circuit, the lines being disposed to pass through an area defined by the first inductor and the second inductor. The first inductor and the second inductor have symmetrical differential structures.

In accordance with an aspect of the disclosure, the first inductor and the second inductor may have spiral structures, respectively, and the first inductor and the second inductor may cross each other at least one location.

In accordance with an aspect of the disclosure, the device may further include a first line connected to an initial end of the first inductor, a second line connected to an initial end of the second inductor, a third line connected to a terminal end of the first inductor, and a fourth line connected to a terminal end of the second inductor.

In accordance with an aspect of the disclosure, the lines connecting the first inductor and the first circuit may include parts that are formed by extending the first line and the third line.

In accordance with an aspect of the disclosure, a first portion of the first inductor and a first portion of the second inductor may be disposed at an upper side of a middle axis that is parallel to the first line and the second line, and a second portion of the first inductor and a second portion of the second inductor may be disposed at a lower side of the middle axis.

In accordance with an aspect of the disclosure, a current flowing through the first portion of the first inductor, the first portion of the second inductor, the first line, and the third line may flow in a first direction, and a current flowing through the second portion of the first inductor, the second portion of the second inductor, the second line, and the fourth line may flow in a second direction.

In accordance with an aspect of the disclosure, the first inductor and the second inductor may have spiral structures, respectively, and the first inductor may be formed to reach a node connected to the third line, after crossing an axis connecting a middle point of the first line and the second line and a middle point of the third line and the fourth line from an upper side to a lower side thereof and crossing the axis from the lower side to the upper side thereof, starting from a node connected to the first line, and the second inductor may be formed to reach a node connected to the fourth line after crossing the axis from the lower side to the upper side and crossing the axis from the upper side to the lower side, starting from a node connected to the second line.

In accordance with an aspect of the disclosure, the electronic circuit may be one of a filter, an impedance matching circuit, and an amplitude circuit.

The device according to various embodiments of the disclosure can decrease an increment of an area due to wiring lines by disposing a path between spiral inductors having the same direction of currents and disposed symmetrically and circuits connected to the inductors in parallel in internal areas of the inductors, and can decrease parasitic inductances due to the parallel connection of the circuits.

Effects which can be acquired by the disclosure are not limited to the above described effects, and other effects that have not been mentioned may be clearly understood by those skilled in the art from the following description.

It may be advantageous to set forth definitions of certain words and phrases used throughout this patent document. For example, the terms "include" and "comprise," as well as derivatives thereof, mean inclusion without limitation, the term "or," is inclusive, meaning and/or, the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like, and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1:
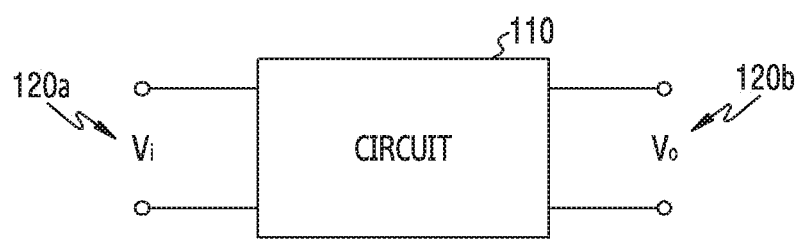
FIG. 1 illustrates an electronic circuit having a differential structure according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

FIGS. 1 through 7, discussed below, and the various embodiments used to describe the principles of the disclosure in this patent document are by way of illustration only and should not be construed in any way to limit the scope of the disclosure. Those skilled in the art will understand that the principles of the disclosure may be implemented in any suitably arranged system or device.

The terms used in the disclosure are only used to describe specific embodiments, and are not intended to limit the disclosure. A singular expression may include a plural expression unless they are definitely different in a context. Unless defined otherwise, all terms used herein, including technical and scientific terms, have the same meaning as those commonly understood by a person skilled in the art to which the disclosure pertains. Such terms as those defined in a generally used dictionary may be interpreted to have the meanings equal to the contextual meanings in the relevant field of art, and are not to be interpreted to have ideal or excessively formal meanings unless clearly defined in the disclosure. In some cases, even the term defined in the disclosure should not be interpreted to exclude embodiments of the disclosure.

Hereinafter, various embodiments of the disclosure will be described based on an approach of hardware. However, various embodiments of the disclosure include a technology that uses both hardware and software and thus, the various embodiments of the disclosure may not exclude the perspective of software.

Hereinafter, the disclosure relates to a device including an electronic circuit for processing a differential signal. For example, the disclosure discloses a circuit structure for reducing an area and reducing a parasitic inductance in an electronic circuit including an inductor.

In the following description, the terms that indicate signals, the terms that indicate materials, the terms that indicate structures, and the terms that indicate shapes are illustrated for convenience of description. Accordingly, the disclosure is not limited to the following terms, and other terms having equivalent technical meanings may be used.

FIG. 1 illustrates an electronic circuit having a differential structure according to an embodiment of the disclosure.

Referring to FIG. 1, a circuit 110 processes a differential signal. The differential signal includes two signals that may be delivered through a pair of lines including two lines, and one signal is electrically connected to a positive electrode and the other signal is electrically connected to a negative electrode. The circuit 110 determines a value on the basis of a difference between the two signals. To achieve this, each of an input end 120a and an output end 120b of the circuit 110 includes two terminals. For example, the circuit 110 may include at least one of a resistor, an inductor, a capacitor, or a transistor. For example, the circuit 110 may be one of a filter, an impedance matching circuit, or an amplitude circuit, and the disclosure is not limited thereto.

Figure 2:
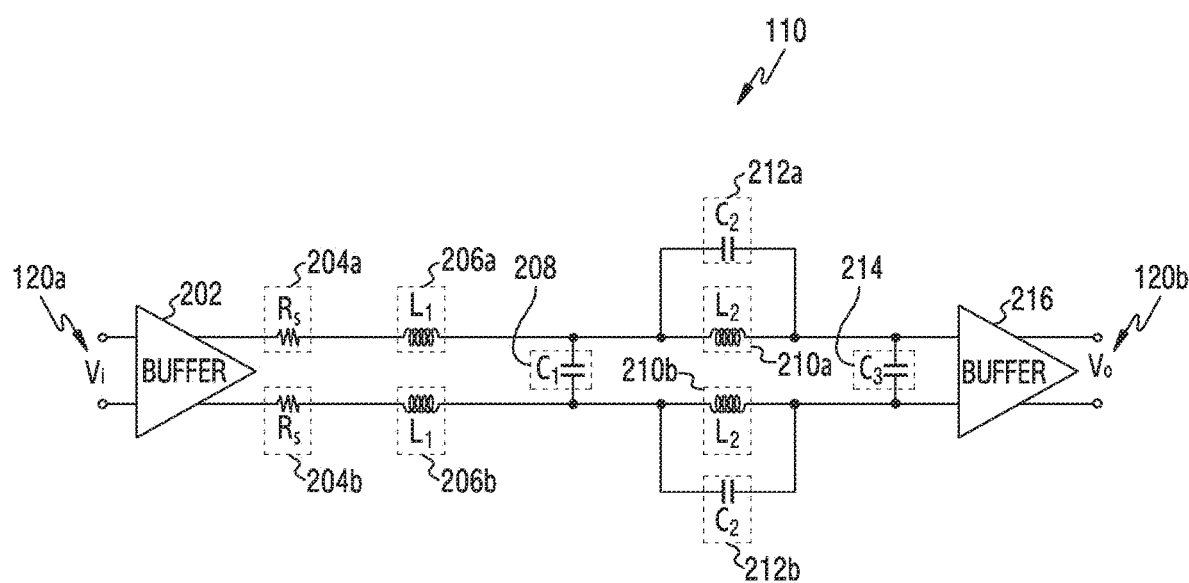
FIG. 2 illustrates an electronic circuit of a differential structure according to an embodiment of the disclosure.

FIG. 2 illustrates an electronic circuit of a differential structure according to an embodiment of the disclosure. FIG. 2 illustrates an example of the circuit 110 implement a filter. The filter illustrated in FIG. 2 has a structure in which a frequency response of a high bandwidth is implemented by using passive elements having a low-noise high linearity instead of an active resistor-capacitor circuit.

Referring to FIG. 2, the circuit 110 includes a buffer 202, resistors 204a and 204b, inductors 206a and 206b, a capacitor 208, inductors 210a and 210b, capacitors 212a and 212b, a capacitor 214, and a buffer 216. The buffer 202, the resistors 204a and 204b, the inductors 206a and 206b, the inductors 210a and 210b, and the buffer 216 are connected to each other in series. The capacitors 212a and 212b are connected to the inductors 210a and 210b in parallel. The capacitor 208 and the capacitor 214 connect the two paths.

Figure 3A:
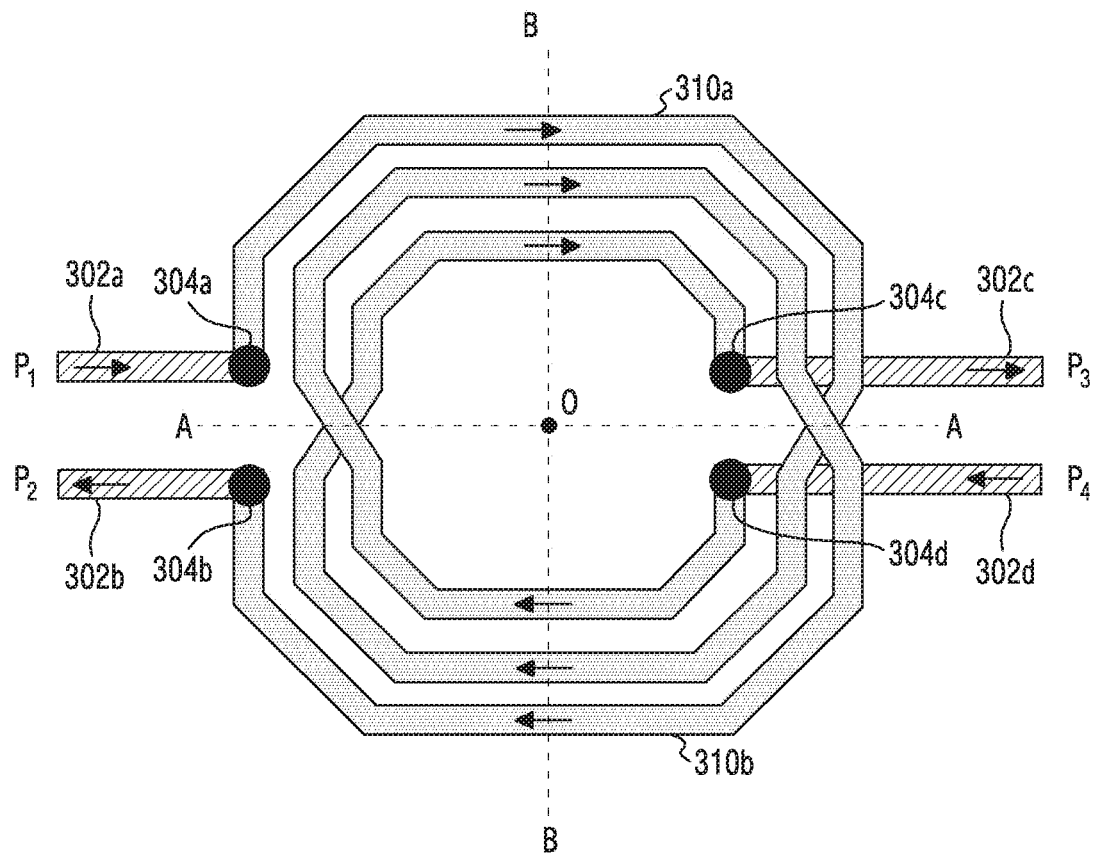
FIG. 3A illustrates implementations of inductors having symmetrical differential structures according to an embodiment of the disclosure.
Figure 3B:
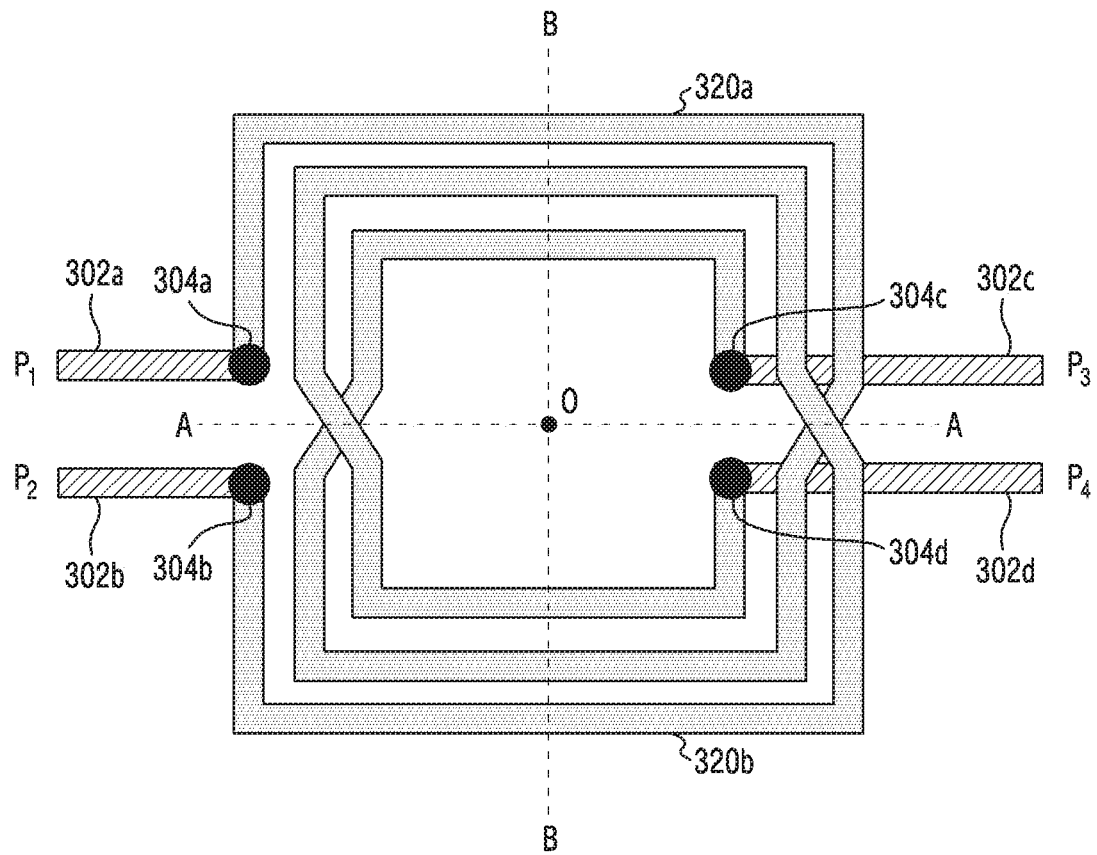
FIG. 3B illustrates implementations of inductors having symmetrical differential structures according to an embodiment of the disclosure.
Figure 3C:
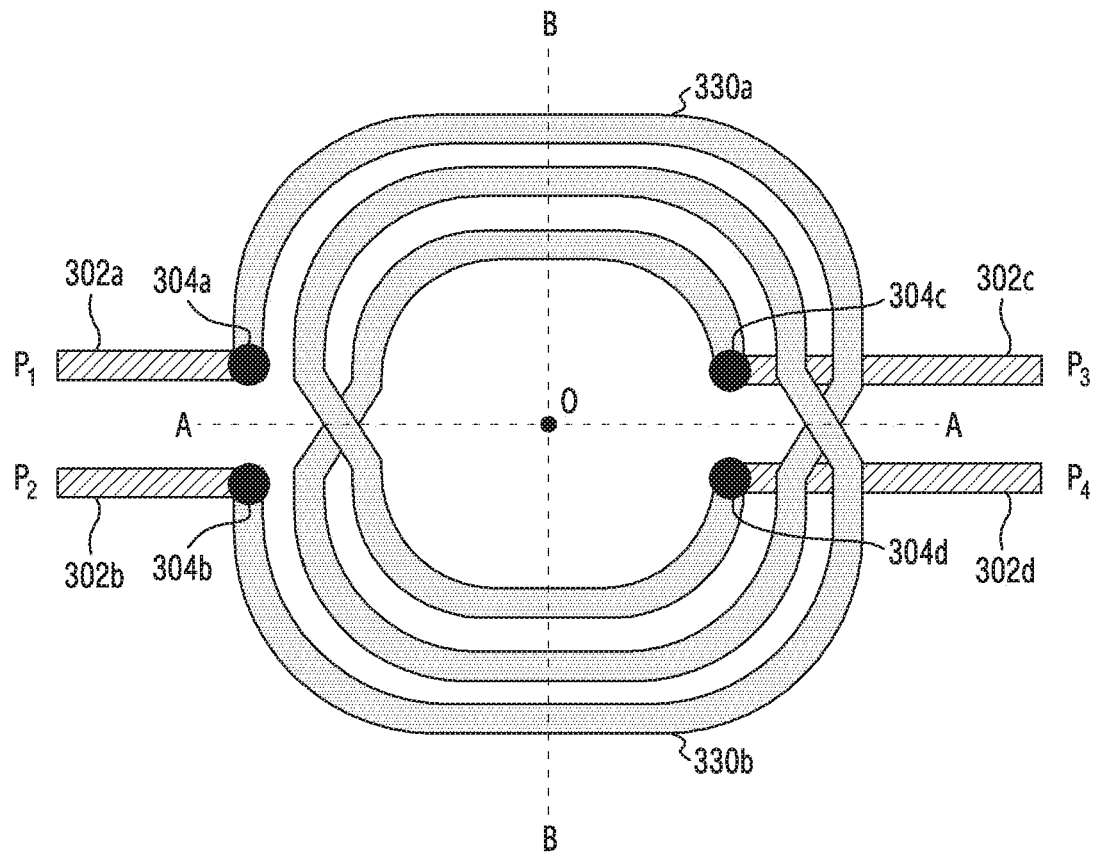
FIG. 3C illustrates implementations of inductors having symmetrical differential structures according to an embodiment of the disclosure.

FIG. 3A illustrates implementations of inductors having symmetrical differential structures according to an embodiment of the disclosure, FIG. 3B illustrates implementations of inductors having symmetrical differential structures according to an embodiment of the disclosure, and FIG. 3C illustrates implementations of inductors having symmetrical differential structures according to an embodiment of the disclosure.

Referring to FIG. 3A, a first inductor 310a is connected to lines 302a and 302c and a second inductor 310b is connected to lines 302b, and 302d. The first inductor 310a, the second inductor 310b, and the lines 302a, 302b, 302c, and 302d may include conductors.

Each of the first inductor 310a and the second inductor 310b has a spiral structure. In the example of FIG. 3A, each of the first inductor 310a and the second inductor 310b has a spiral structure that is rotated by 1.5 times, but according to another embodiment, may have the number of rotations of 1 or 2 or more. If the number of rotations increases, the inductance of the corresponding inductor increases.

The line 302a connected to the terminal $P_1$ and the line 302b connected to the terminal $P_2$ are a pair of lines that deliver a differential signal, and the line 302a is connected to the first inductor 310a at a node 304a and the line 302b is connected to the second inductor 310b at a node 304b. The line 302c connected to the terminal $P_3$ and the line 302d connected to the terminal $P_4$ are a pair of lines that deliver a differential signal, and the line 302c is connected to the first inductor 310a at a node 304c and the line 302d is connected to the second inductor 310b at a node 304d.

After crossing the upper side of axis B-B, the right side of axis A-A, the lower side of axis B-B, and the left side of axis A-A with respect to point O, starting from the node 304a, the first inductor 310a terminates at the node 304c. After crossing the lower side of axis B-B, the right side of axis A-A, the upper side of axis B-B, and the left side of axis A-A with respect to point O, starting from the node 304b, the second inductor 310b terminates at the node 304d.

When observed on one surface viewed as illustrated in FIG. 3A, the first inductor 310a and the second inductor 310b cross each other at least once. Accordingly, in an upper area of axis A-A, a portion of the second inductor 310b is disposed between portions that constitute the first inductor 310a. Similarly, in a lower area of axis A-A, a portion of the first inductor 310a is disposed between portions that constitute the second inductor 310b. Accordingly, the directions of the currents in the upper area of axis A-A are an identical direction that is from the left side to the right side, and the directions of the currents in the lower area of axis A-A are an identical direction, that is from the right side to the left side.

When observed on a side of one surface viewed as illustrated in FIG. 3A, the lines 302c and 302d are disposed on the lower side of the first inductor 310a and the second inductor 310b. However, according to another embodiment, at least one of the line 302c and the line 302d may be disposed on the upper side of the first inductor 310a and the second inductor 310b. Similarly, the second inductor 310b is disposed on the upper side of the first inductor 310a at a cross point of the first inductor 310a and the second inductor 310b, but according to another embodiment, the first inductor 310a may be disposed on the upper side of the second inductor 310b.

Referring to FIG. 3A, each of the first inductor 310a and the second inductor 310b of spiral structures has an octagonal shape. Referring to FIG. 3B, according to another embodiment, the first inductor 310a and the second inductor 310b may be tetragonal inductors 320a and 320b. Referring to FIG. 3C, according to another embodiment, the first inductor 310a and the second inductor 310b may be circular inductors 330a and 330b.

Referring to FIGS. 3A to 3C, the inductors having spiral structures that cross each other at least once may be referred to as 'inductors having symmetrical differential structures', 'inductors of differentially symmetric structures', 'symmetric differential inductors', 'differentially symmetric inductors', 'differentially coupled series inductors' or terms having an equivalent technical meaning. The inductors having symmetrical differential structures include inductors of spiral structures that cross each other at least once when observed on one surface, and areas that are occupied by the inductors at least partially overlap each other.

Figure 4:
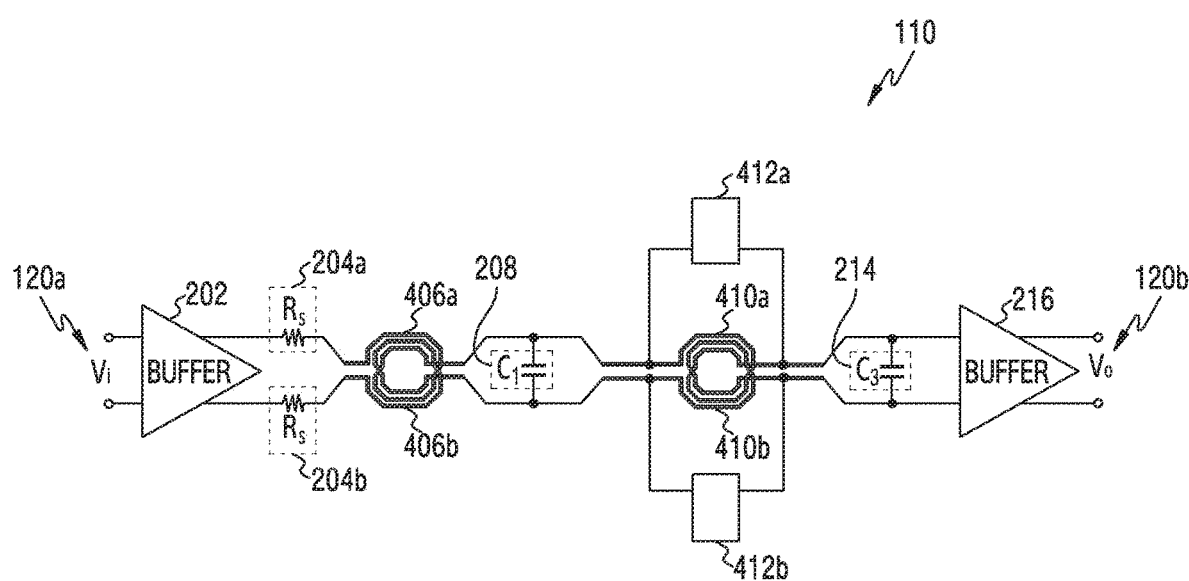
FIG. 4 illustrates an implementation of an electronic circuit including inductors having symmetrical differential structures according to an embodiment of the disclosure.

FIG. 4 illustrates an implementation of an electronic circuit including inductors having symmetrical differential structures according to an embodiment of the disclosure. FIG. 4 is an example of the circuit 110 implement a filter, and is an implementation in which the inductors (e.g., the inductors 206a and 206b and the inductors 210a and 210b) are replaced by the inductors 406a, 406b, 410a, and 410b.

Referring to FIG. 4, the circuit 110 includes a buffer 202, resistors 204a and 204b, inductors 406a and 406b, a capacitor 208, inductors 410a and 410b, circuits 412a and 412b, a capacitor 214, and a buffer 216. The buffer 202, the resistors 204a and 204b, the inductors 406a and 406b, the inductors 410a and 410b, and the buffer 216 are connected to each other in series. The circuits 412a and 412b are connected to the inductors 410a and 410b in parallel. The capacitor 208 and the capacitor 214 connect two paths. The circuits 412a and 412b may include at least one of a resistor, a capacitor, an inductor, and a transistor. The circuits 412a and 412b and the inductors 410a and 410b hereinafter may be connected to each other as illustrated in FIG. 5A.

Figure 5A:
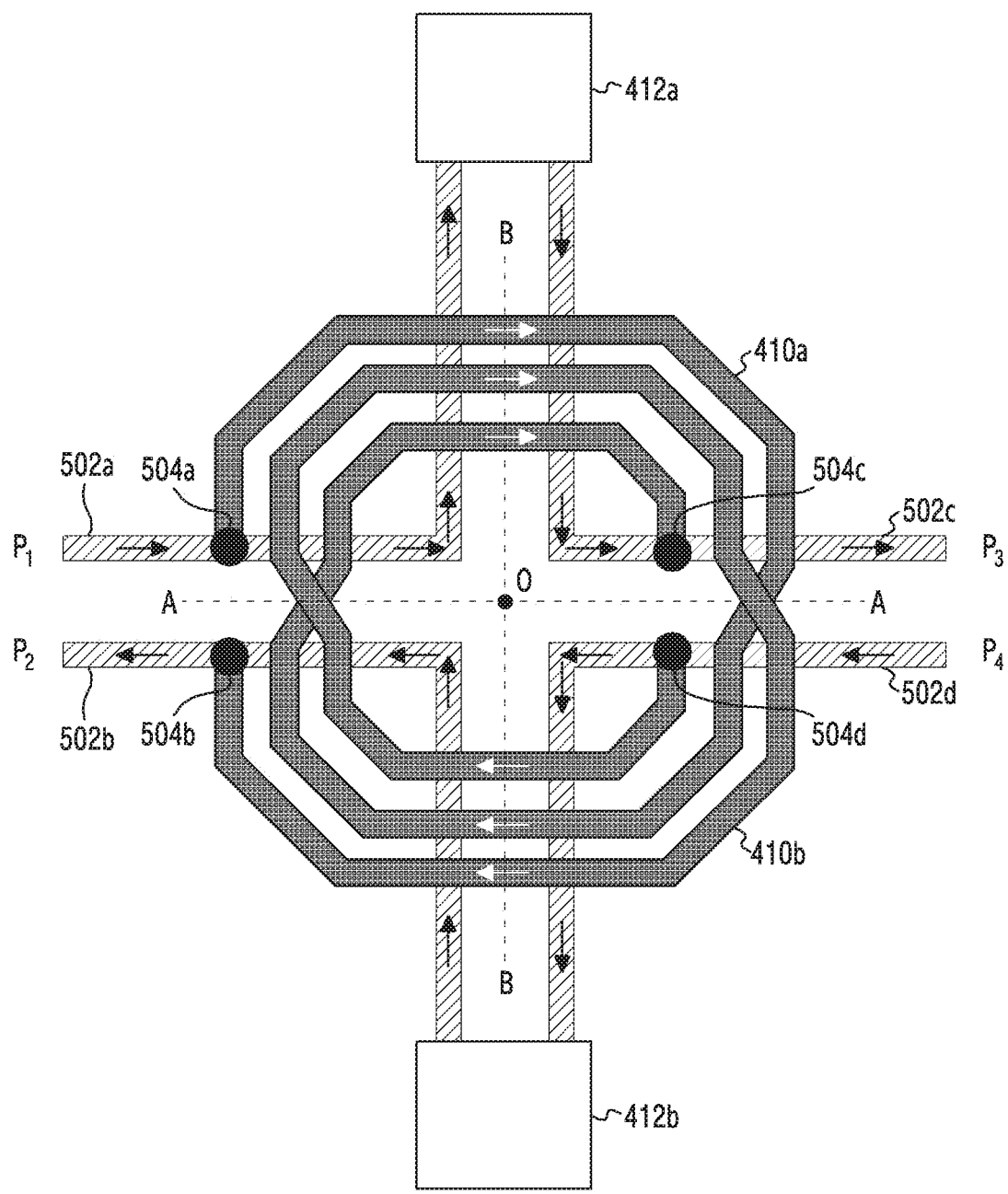
FIG. 5A illustrates a connection structure of inductors having symmetrical differential structures and other circuits according to an embodiment of the disclosure.

FIG. 5A illustrates a connection structure of inductors having symmetrical differential structures and other circuits according to an embodiment of the disclosure.

Referring to FIG. 5A, the first inductor 410a and the second inductor 410b have structures that are similar to the first inductor 310a and the second inductor 310b illustrated in FIG. 3A. The first inductor 410a is connected to a line 502a connected to the terminal $P_1$ at a node 504a, and is connected to a line 502c connected to a terminal $P_3$ at a node 504c. The second inductor 410b is connected to a line 502b connected to the terminal $P_2$ at a node 504b, and is connected to a line 502d connected to the terminal $P_4$ at a node 504d.

The first inductor 410a and the circuit 412a are connected to each other in parallel through the line 502a and the line 502c, and the second inductor 410b and the circuit 412b are connected to each other in parallel through the line 502b and the line 502d. The line 502a and the line 502c are disposed to pass a signal through the interior of the first inductor 410a. Similarly, the line 502b and the line 502d are disposed to pass a signal through the interior of the second inductor 410b. In other words, the lines 502a, 502b, 502c, and 502d are disposed to pass through the interior of an area defined by the first inductor 410a or the second inductor 410b.

The lines 502a, 502b, 502c, and 502d are formed toward the interiors of the first inductor 410a and the second inductor 410b by extending the lines that deliver a differential signal. That is, the lines 502a, 502b, 502c, and 502d are formed from the nodes 504a, 504b, 504c, and 504d in parallel to axis A-A. Further, the line 502a and the line 502c are formed from the interiors of the first inductor 410a and the second inductor 410b toward the circuit 412a vertically and in parallel to axis B-B, and the line 502b and the line 502d are formed from the interiors of the first inductor 410a and the second inductor 410b toward the circuit 412a vertically and in parallel to axis B-B. That is, each of the lines 502a, 502b, 502c, and 502d includes a portion that is parallel to axis A-A and a portion that is parallel to axis B-B, and the two portions are connected to each other in the interiors of the first inductor 410a and the second inductor 410b with respect to point O.

In an example of FIG. 5A, the portion of each of the lines 502a, 502b, 502c, and 502d, which is parallel to axis A-A, and the portion of each of the lines 502a, 502b, 502c, and 502d, which is parallel to axis B-B, are connected to each other at the right angle. According to another embodiment, an intermediate part that connects the portion that is parallel to axis A-A and the portion that is parallel to axis B-B may be added, and the intermediate part may have shapes of a curve, a line, or two or more lines, which reduces a parasitic impedance associated with a geometrical incongruity.

Figure 5B:
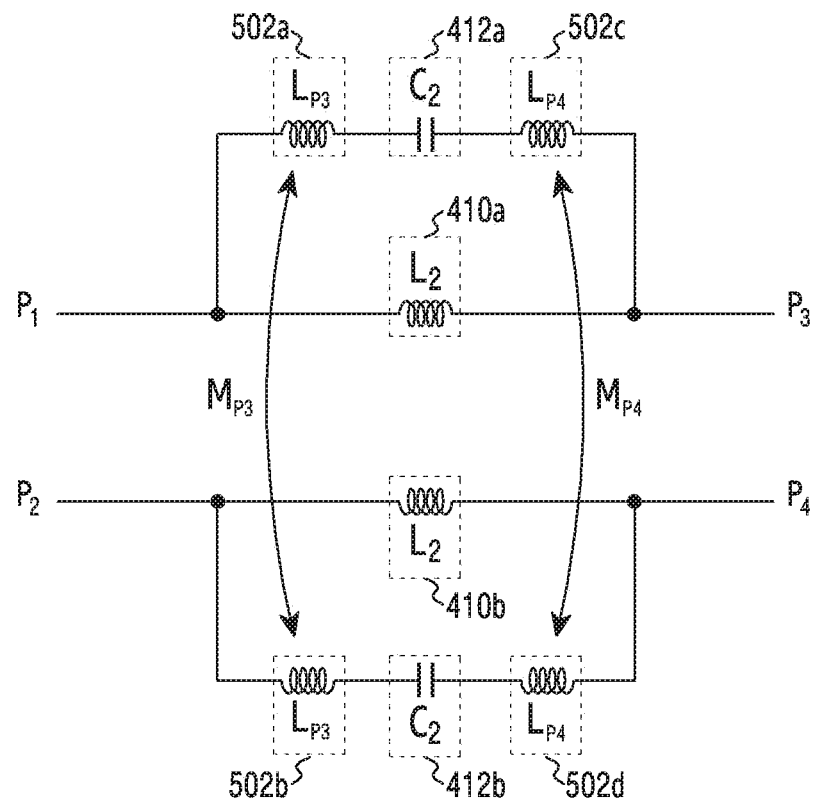
FIG. 5B illustrates an equivalent circuit of inductors having symmetrical differential structures and other circuits according to an embodiment of the disclosure.

FIG. 5B illustrates an equivalent circuit of inductors having symmetrical differential structures and other circuits according to an embodiment of the disclosure. FIG. 5B is an equivalent circuit of inductors and circuits illustrated in FIG. 5A, and illustrates a case in which each of the circuits 412a and 412b includes one capacitor.

Referring to FIG. 5B, each of the first inductor 410a and the second inductor 410b has an inductance of $L_2$, and the circuit 412 and the circuit 412b includes a capacitor having a capacitance of $C_2$. Parasitic inductances are generated due to the lines 502a, 502b, 502c, and 502d, and the line 502a and the line 502b have a parasitic inductance of $L_{P3}$ and the line 502c and the line 502d have a parasitic inductance of $L_{P4}$. Further, a mutual inductance of $M_{P3}$ is generated between the line 502a and the line 502b, and a mutual inductance of $M_{P4}$ is generated between the line 502c and the line 502d.

Unlike the example of FIG. 5A, when the lines 502a, 502b, 502c, and 502d are disposed not in the interiors of the inductors 410a and 410b but in an external detour path, the coupling between the parasitic capacitances generated by the lines 502a, 502b, 502c, and 502d is low. Accordingly, the parasitic capacitances may directly influence the circuit.

However, as in the example of FIG. 5A, when the lines 502a, 502b, 502c, and 502d are disposed in the interiors of the inductors 410a and 410b, the lines 502a, 502b, 502c, and 502d maintain a path for the differential signal for at least a portion thereof, and thus the directions of the currents at the corresponding portion are changed. As such, the mutual inductances (e.g., $M_{P3}$ and $M_{P4}$) may have negative values. Accordingly, at least a portion of the parasitic inductances may be offset.

Further, as in the example of FIG. 5A, when the lines 502a, 502b, 502c, and 502d are disposed in the interiors of the inductors 410a and 410b, the lines 502a, 502b, 502c, and 502d cross the inductors 410a and 410b from the outside to the inside of the inductors 410a and 410b. Accordingly, the influences of the parasitic inductances generated due to the coupling may be decreased by the mutual inductances.

As described above, when the inductors having symmetrical differential structures and other circuits are connected to each other in parallel, deterioration of performance due to the parasitic inductances can be alleviated by employing the structure of FIG. 5A.

As discussed with reference to FIGS. 5A and 5B, the lines 502a, 502b, 502c, and 502d are disposed in the interiors of the inductors 410a and 410b, and thus at least a portion of the parasitic inductances can be offset. Although it has been described with reference to FIGS. 5A and 5B that the parasitic inductances generated by the lines 502a, 502b, 502c, and 502d are one component, the parasitic inductances may be divided into a plurality of parasitic inductances according to directions on the basis of another circuit analysis. For example, the parasitic inductances hereinafter may be understood as illustrated in FIG. 6A.

Figure 6A:
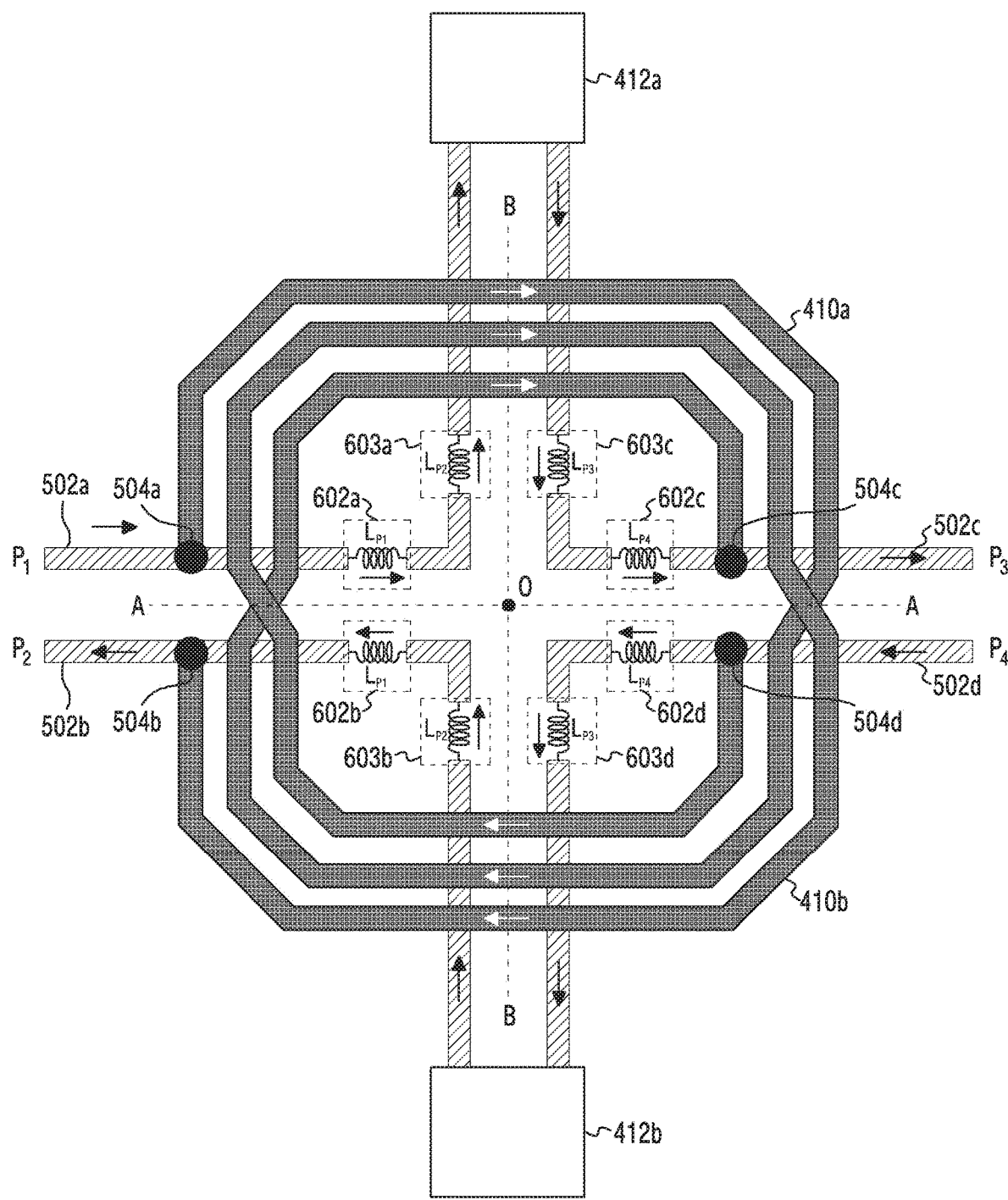
FIG. 6A illustrates parasitic inductances generated by a connection structure of inductors having symmetrical differential structures and other circuits according to an embodiment of the disclosure.

FIG. 6A illustrates parasitic inductances generated by a connection structure of inductors having symmetrical differential structures and other circuits according to an embodiment of the disclosure.

Referring to FIG. 6A, the first inductor 410a, the second inductor 410b, and the lines 502a, 502b, 502c, and 502d have structures that are similar to the structure described with reference to FIG. 5A. Parasitic inductances are generated in the lines 502a, 502b, 502c, and 502d, respectively. For example, in the line 502a, a first parasitic inductance 602a of $L_{P1}$ may be generated in a horizontal axis (e.g., a portion that is parallel to axis A-A) and a second parasitic inductance 603a of $L_{P2}$ may be generated in a vertical axis (e.g., a portion that is parallel to axis B-B). In the line 502b, a first parasitic inductance 602b of $L_{P1}$ may be generated in a horizontal axis (e.g., a portion that is parallel to axis A-A) and a second parasitic inductance 603b of $L_{P2}$ may be generated in a vertical axis (e.g., a portion that is parallel to axis B-B). In the line 502c, a first parasitic inductance 602c of $L_{P4}$ may be generated in a horizontal axis (e.g., a portion that is parallel to axis A-A) and a second parasitic inductance 603c of $L_{P3}$ may be generated in a vertical axis (e.g., a portion that is parallel to axis B-B). In the line 502d, a first parasitic inductance 602d of $L_{P3}$ may be generated in a horizontal axis (e.g., a portion that is parallel to axis A-A) and a second parasitic inductance 603d of $L_{P4}$ may be generated in a vertical axis (e.g., a portion that is parallel to axis B-B).

Figure 6B:
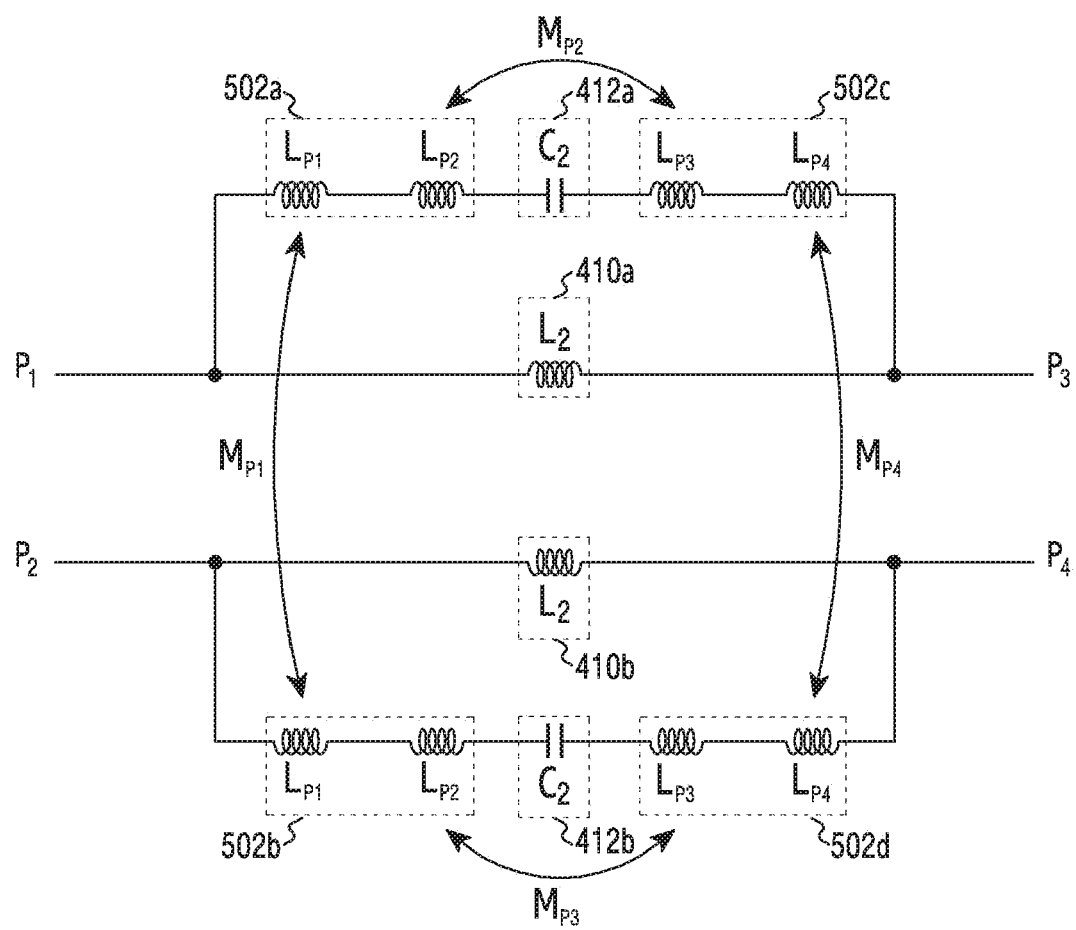
FIG. 6B illustrates another equivalent circuit of inductors having symmetrical differential structures and other circuits according to an embodiment of the disclosure.

FIG. 6B illustrates an equivalent circuit of inductors having symmetrical differential structures and other circuits according to an embodiment of the disclosure. FIG. 6B may be an equivalent circuit of inductors and circuits as illustrated in FIG. 6A, and illustrates a case in which each of the circuits 412a and 412b includes one capacitor.

Referring to FIG. 6B, each of the first inductor 410a and the second inductor 410b has an inductance of $L_2$, and the circuit 412a and the circuit 412b includes a capacitor having a capacitance of $C_2$. Parasitic inductances are generated due to the lines 502a, 502b, 502c, and 502d, and the line 502a and the line 502b have parasitic inductances of $L_{P1}$ and $L_{P2}$ and the line 502c and the line 502d have parasitic inductance of $L_{P3}$ and $L_{P4}$.

Due to the parasitic inductances of the horizontal axis, a mutual inductance of $M_{P1}$ is generated between the line 502a and the line 502b, and a mutual inductance of $M_{P4}$ is generated between the line 502c and the line 502d. Further, due to the parasitic inductances of the vertical axis, a mutual inductance of $M_{P2}$ is generated between the line 502a and the line 502b, and a mutual inductance of $M_{P3}$ is generated between the line 502b and the line 502d.

Referring to FIG. 6B, the lines 502a, 502b, 502c, and 502d are disposed in the interiors of the inductors 410a and 410b. Accordingly, because the lines 502a, 502b, 502c, and 502d maintain the path of the differential signal for at least a portion thereof, the directions of the current at the corresponding portion are changed. As such, the mutual inductances (e.g., $M_{P1}$, $M_{P2}$, $M_{P3}$, and $M_{P4}$) due to this structure may have negative values. Accordingly, at least a portion of the parasitic inductances may be offset by the mutual inductances.

Further, as in the example of FIG. 6A, because the lines 502a, 502b, 502c, and 502d are disposed in the interiors of the inductors 410a and 410b, the lines 502a, 502b, 502c, and 502d cross the inductors 410a and 410b from the outside to the inside of the inductors 410a and 410b. Accordingly, the influences of the parasitic inductances generated due to the coupling may be decreased by the mutual inductances.

Figure 7:
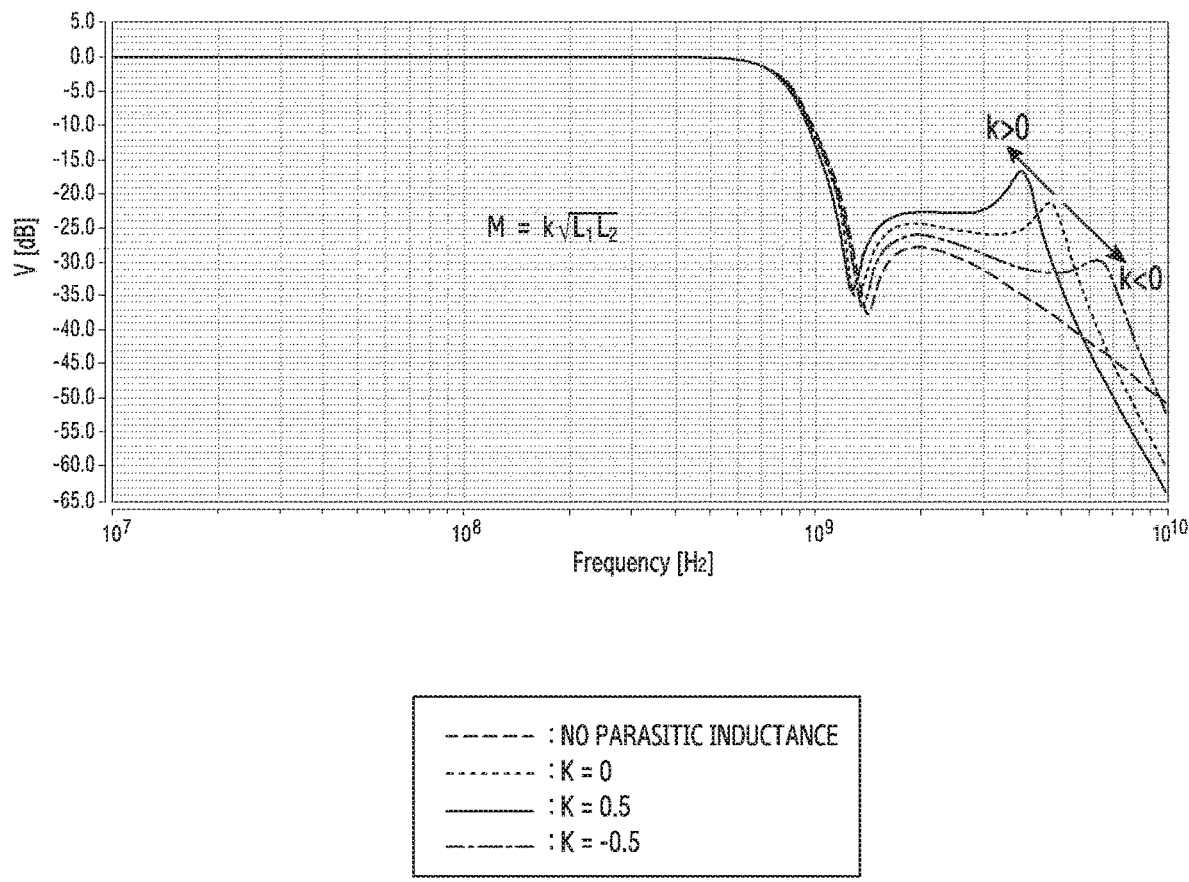
FIG. 7 illustrates a performance of a parallel connection structure according to an embodiment of the disclosure.

FIG. 7 illustrates a performance of a parallel connection structure according to an embodiment of the disclosure. FIG. 7 illustrates output voltages for frequencies of a circuit (e.g., the circuit 110 of FIG. 2) for the structure illustrated in FIG. 5A.

Referring to FIG. 7, a mutual inductance (e.g., $M_{P3}$) due to the parasitic inductances of the lines (e.g., the lines 502a, 502b, 502c, and 502d) is determined according to $k\sqrt{L_1 L_2}$ (k is a coefficient, and $L_1$ and $L_2$ are parasitic inductances). As described with reference to FIGS. 5A and 5B, when the mutual inductance has a negative value, that is, when k is a negative number, a performance that is most similar to the case in which there is no parasitic capacitance is shown.

Methods according to embodiments stated in claims and/or specifications of the disclosure may be implemented in hardware, software, or a combination of hardware and software.

When the methods are implemented by software, a computer-readable storage medium for storing one or more programs (software modules) may be provided. The one or more programs stored in the computer-readable storage medium may be configured for execution by one or more processors within the electronic device. The at least one program may include instructions that cause the electronic device to perform the methods according to various embodiments of the disclosure as defined by the appended claims and/or disclosed herein.

The programs (software modules or software) may be stored in non-volatile memories including a random access memory and a flash memory, a Read Only Memory (ROM), an Electrically Erasable Programmable Read Only Memory (EEPROM), a magnetic disc storage device, a Compact Disc-ROM (CD-ROM), Digital Versatile Discs (DVDs), or other type optical storage devices, or a magnetic cassette. Alternatively, any combination of some or all of the may form a memory in which the program is stored. Further, a plurality of such memories may be included in the electronic device.

In addition, the programs may be stored in an attachable storage device which is accessible through communication networks such as the Internet, Intranet, local area network (LAN), wide area network (WAN), and storage area network (SAN), or a combination thereof. Such a storage device may access the electronic device via an external port. Further, a separate storage device on the communication network may access a portable electronic device.

In the above-described detailed embodiments of the disclosure, a component included in the disclosure is expressed in the singular or the plural according to a presented detailed embodiment. However, the singular form or plural form is selected for convenience of description suitable for the presented situation, and various embodiments of the disclosure are not limited to a single element or multiple elements thereof. Further, either multiple elements expressed in the description may be configured into a single element or a single element in the description may be configured into multiple elements.

While the disclosure has been shown and described with reference to certain embodiments thereof, it will be understood by those skilled in the art that various changes in form and details may be made therein without departing from the spirit and scope of the disclosure as defined by the appended claims and their equivalents.

What is claimed is:

1. An apparatus including an electronic circuit, the apparatus comprising:
   a first inductor and a second inductor that process a differential signal;
   a first circuit connected to the first inductor in parallel; and
   a second circuit connected to the second inductor in parallel,
   wherein lines connect the first inductor and the first circuit, the lines being disposed to pass through an area defined by the first inductor and the second inductor,
   wherein the first inductor and the second inductor have symmetrical differential structures, and
   wherein the first inductor and the second inductor cross each other in at least one location.

2. The apparatus of claim 1,
wherein each of the first inductor and the second inductor include spiral structures, respectively.

3. The apparatus of claim 1, further comprising:
a first line connected to an initial end of the first inductor;
a second line connected to an initial end of the second inductor;
a third line connected to a terminal end of the first inductor; and
a fourth line connected to a terminal end of the second inductor.

4. The apparatus of claim 3, wherein the lines connecting the first inductor and the first circuit comprise parts that are formed by extending the first line and the third line.

5. The apparatus of claim 3,
wherein a first portion of the first inductor and a first portion of the second inductor are disposed at an upper side of a middle axis that is parallel to the first line and the second line, and
wherein a second portion of the first inductor and a second portion of the second inductor are disposed at a lower side of the middle axis.

6. The apparatus of claim 5,
wherein a current flowing through the first portion of the first inductor, the first portion of the second inductor, the first line, and the third line flows in a first direction, and
wherein a current flowing through the second portion of the first inductor, the second portion of the second inductor, the second line, and the fourth line flows in a second direction.

7. The apparatus of claim 3,
wherein each of the first inductor and the second inductor include spiral structures, respectively,
wherein the first inductor is formed to connect a node connected to the third line, after crossing an axis connecting a middle point of the first line and the second line and a middle point of the third line and the fourth line from an upper side to a lower side thereof and crossing the axis from the lower side to the upper side thereof, starting from a node connected to the first line, and
wherein the second inductor is formed to connect a node connected to the fourth line after crossing the axis from the lower side to the upper side and crossing the axis from the upper side to the lower side, starting from a node connected to the second line.

8. The apparatus of claim 1, wherein the electronic circuit is one of a filter, an impedance matching circuit, or an amplitude circuit.

9. The apparatus of claim 1, wherein an average radius of the first inductor decreases every circular constant (rad).

10. The apparatus of claim 1, wherein an average radius of the second inductor increases every circular constant (rad).

11. The apparatus of claim 1, wherein the first circuit and the second circuit are located outside of the area defined by the first inductor and the second inductor.

12. The apparatus of claim 1, further comprising lines connecting the second inductor and the second circuit.

13. The apparatus of claim 12, wherein a direction of current on the lines connecting the first inductor and the first circuit is opposite to a direction of current on the lines connecting the second inductor and the second circuit.

14. The apparatus of claim 13, wherein a mutual inductance associated with the lines connecting the first inductor and the first circuit and the lines connecting the second inductor and the second circuit comprises a negative value.

15. The apparatus of claim 3,
wherein the initial end of the first inductor is connected to a portion of the first inductor having a largest radius,
wherein the terminal end of the first inductor is connected to a portion of the first inductor having a smallest radius,
wherein the initial end of the second inductor is connected to a portion of the second inductor having a smallest radius, and
wherein the terminal end of the second inductor is connected to a portion of the second inductor having a largest radius.

16. A circuit comprising:
a first inductor configured to conduct a current in a first direction, the first inductor being connected to an initial node at a first position on an axis and a terminal node at a second position on the axis, and comprising at least one and a half loops that decrease in radius at a junction every half loop;
a second inductor configured to conduct a current in a second direction that is opposite to the first direction, the second inductor being connected to an initial node at the second position on the axis and a terminal node at the first position on the axis, and comprising at least one and a half loops that increase in radius at a junction every half loop;
a first circuit connected to the first inductor in parallel; and
a second circuit connected to the second inductor in parallel.

17. The circuit of claim 16, further comprising:
first lines connecting the first inductor and the first circuit, the first lines being disposed to pass through an area defined by the first inductor and the second inductor; and
second lines connecting the second inductor and the second circuit, the second lines being disposed to pass through the area defined by the first inductor and the second inductor.

18. The circuit of claim 17, wherein the first circuit and the second circuit are located outside of the area defined by the first inductor and the second inductor.

19. The circuit of claim 18, wherein a mutual inductance associated with the first lines and the second lines comprises a negative value.

20. The circuit of claim 19, wherein the circuit is one of a filter, an impedance matching circuit, or an amplitude circuit.

* * * * *